United States Patent [19]

Lee

[11] Patent Number: 5,804,992
[45] Date of Patent: Sep. 8, 1998

[54] SENSE AMPLIFIER OF SEMICONDUCTOR MEMORY DEVICE

[75] Inventor: Sung-Han Lee, Seoul, Rep. of Korea

[73] Assignee: Hyundai Electronics Industries Co., Ltd., Kyoungki-do, Rep. of Korea

[21] Appl. No.: 774,844

[22] Filed: Dec. 27, 1996

[30] Foreign Application Priority Data

Dec. 30, 1995 [KR] Rep. of Korea ............ 95-69514

[51] Int. Cl.$^6$ ............................................. G11C 7/06
[52] U.S. Cl. ........................... 327/51; 327/55; 327/57
[58] Field of Search ..................... 327/51–57; 365/203, 365/185.2, 185.25

[56] References Cited

U.S. PATENT DOCUMENTS

| | | | |
|---|---|---|---|
| 4,716,320 | 12/1987 | McAdams | 327/52 |
| 5,247,483 | 9/1993 | Okamoto | 365/205 |
| 5,491,435 | 2/1996 | Mun et al. | 327/57 |
| 5,559,737 | 9/1996 | Tanaka et al. | 365/149 |
| 5,668,765 | 9/1997 | Ang | 327/57 |

*Primary Examiner*—Toan Tran
*Attorney, Agent, or Firm*—Ware, Fressola, Van Der Sluys & Adolphson LLP

[57] ABSTRACT

A sense amplifier of a semiconductor memory device which increases a voltage difference between a bit line and a dummy line is disclosed. The sense amplifier includes: a sense amplifying unit which pre-charges voltages of a dummy line connected to a dummy cell and of a bit line connected to a memory cell by a first equalizing signal, and which senses and amplifies data from the memory cell by inputting the voltages of the dummy line and the bit line by a sense amplifier enable signal; and a voltage variable unit which adjusts the voltages of the dummy line and the bit line by a second equalizing signal, said voltage variable unit having a first voltage variable part which adjusts the voltage of the dummy line by the second equalizing signal and a second voltage variable part which adjusts the voltage of the bit line by the second equalizing signal.

9 Claims, 5 Drawing Sheets

SENSE AMPLIFIER OF SEMICONDUCTOR MEMORY DEVICE

BACKGROUND OF THE INVENTION

1. Field of the Invention

The present invention relates to a nonvolatile semiconductor memory device, and more particularly, to a sense amplifier of a semiconductor memory device which can enlarge a sensing margin by increasing a voltage difference between a bit line and a dummy line.

2. Discussion of Related Art

General nonvolatile semiconductor memory devices, which still retain stored data even when power is turned off, are of various types such as a mask read only memory (ROM), an erasable and programmable ROM (EPROM) which can read and write data, an electrically erasable and programmable ROM (EEPROM), a flash EEPROM and so on. The mask ROM is a memory device wherein one bit of data is stored in a single cell transistor and only a reading operation for the data can be executed. It is commonly used in electronic office appliances such as electronic pocket books and printers or in video game machines requiring a high speed operation.

FIG. 1 is a circuit diagram illustrating a sense amplifier of a conventional semiconductor memory device. In the circuit, referring to FIG. 1, the sense amplifier includes first and second PMOS transistors PM11 and PM12 having their gates to which an equalizing signal /EQ from an equalizer is applied, to thereby pre-charge a dummy line 3 connected to a dummy cell 1 and a bit line 4 connected to a memory cell 2 to a predetermined voltage level. Moreover, the sense amplifier includes a first inverter which is comprised of a third PMOS transistor PM13 and a first NMOS transistor NM11 and a second inverter which is comprised of a fourth PMOS transistor PM14 and a second NMOS transistor NM12. The first and second inverters are connected to form a latch type.

Furthermore, the sense amplifier preferably includes a third NMOS transistor NM13 which a sense amplifier enable signal SE is applied to, a fourth NMOS transistor MN14 as a pass transistor which supplies a signal applied via the dummy line 3 from the dummy cell 1 to the first inverter as an input signal, a fifth NMOS transistor NM15 as a pass transistor which supplies a signal applied via the bit line 4 from the memory cell 2 to the second inverter as an input signal and a sixth NMOS transistor NM16 which equalizes the dummy line 3 and the bit line 4.

The sense amplifier as shown in FIG. 1, senses and amplifies data from a memory cell in a semiconductor memory device of high capacity using a voltage difference between the dummy line 3 connected to the dummy cell 1 and the bit line 4 connected to the memory cell 2, and then outputs the sensed and amplified result via an output terminal SAOUT.

Such a conventional sense amplifier, however, senses data of the memory cell simply using the voltage difference between the dummy line 3 and the bit line 4, and therefore, if the voltage difference is below a predetermined level, there is a problem in that an accurate sensing result cannot be obtained.

SUMMARY OF THE INVENTION

Accordingly, the present invention is directed to a sense amplifier of a semiconductor memory device that substantially obviates one or more of the problems due to limitations and disadvantages of the related art.

An object of the invention is to provide a sense amplifier of a semiconductor memory device which is capable of adjusting capacitance of a gate oxide film capacitor by an equalizing signal to thereby vary voltages of a dummy line and a bit line, so that a voltage difference between the dummy line and the bit line can be increased to accurately sense data from a memory cell.

To achieve the above and other objects of the present invention, a sense amplifier of a semiconductor memory device includes: a sense amplifying unit which pre-charges voltages of a dummy line connected to a dummy cell and of a bit line connected to a memory cell by a first equalizing signal, and which senses and amplifies data from the memory cell by inputting the voltages of the dummy line and the bit line by a sense amplifier enable signal; and a voltage variable unit which adjusts the voltages of the dummy line and the bit line by a second equalizing signal, said voltage variable unit having a first voltage variable part which adjusts the voltage of the dummy line by the second equalizing signal and a second voltage variable part which adjusts the voltage of the bit line by the second equalizing signal.

It is to be understood that both the foregoing general description and the following detailed description are exemplary and explanatory and are intended to provide further explanation of the invention as claimed.

BRIEF DESCRIPTION OF THE ATTACHED DRAWINGS

Further objects and advantages of the present invention will be apparent from the following description with reference being to the accompanying drawings wherein preferred embodiments of the present invention are clearly shown.

In the drawings:

FIGS. 3A-1 and 3B-1 are waveform diagrams illustrating operation characteristics of first and second capacitors within a voltage variable unit of FIG. 2;

FIG. 3A-2 shows a variable capacitor with a power supply voltage Vcc of logic "high" level applied;

FIG. 3B-2 shows a variable capacitor with a ground voltage Vss of logic "low" level applied.

DETAILED DESCRIPTION OF PREFERRED EMBODIMENT

Reference will now be made in detail to the preferred embodiments of the present invention, examples of which are illustrated in the accompanying drawings.

Figure 2:
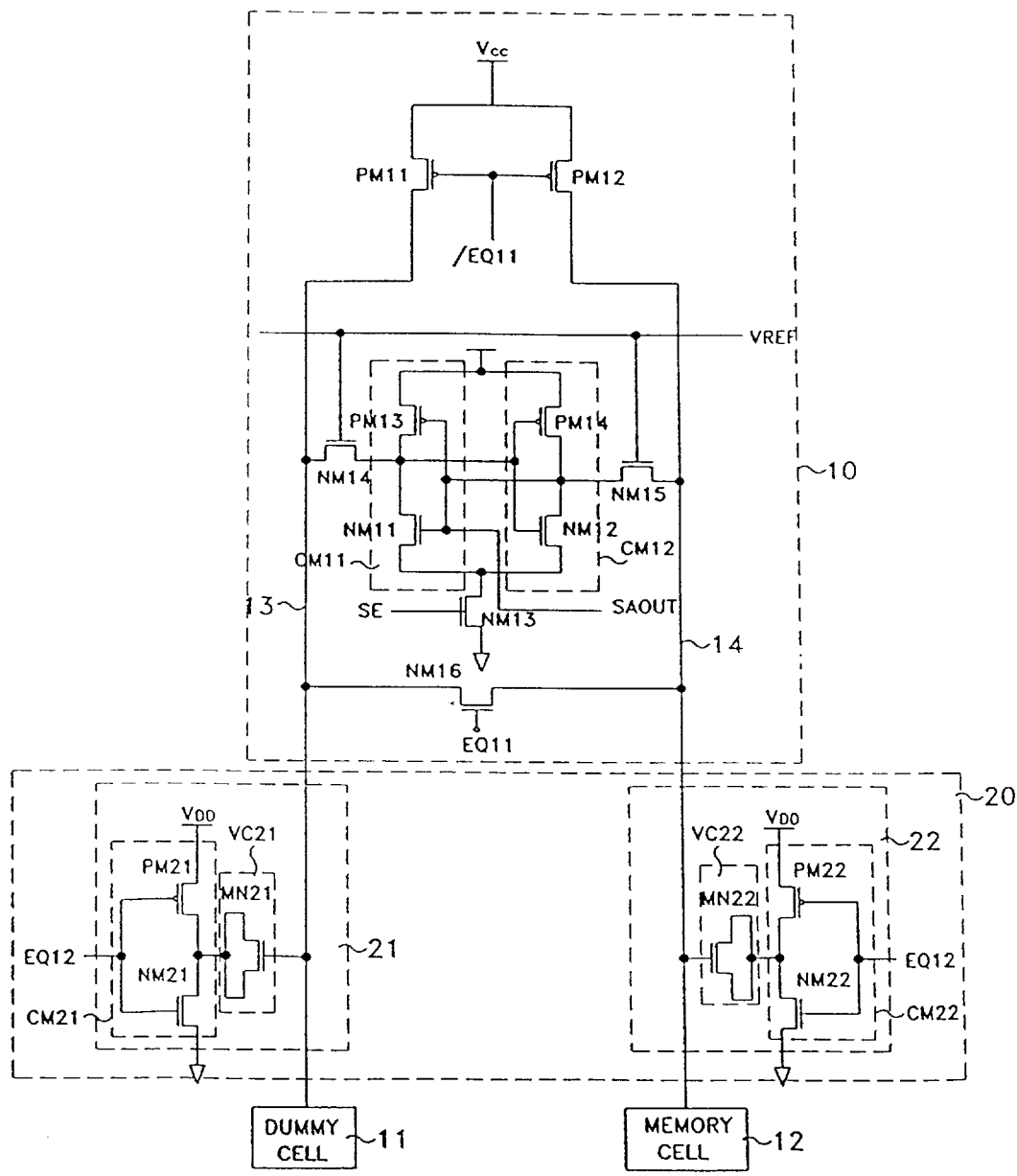
FIG. 2 is a circuit diagram illustrating a sense amplifier of a semiconductor memory device according to the present invention.

FIG. 2 is a circuit diagram illustrating a sense amplifier of a semiconductor memory device according to the present invention. Referring to FIG. 2, the sense amplifier comprises a sense amplifying unit 10 which inputs voltages of a dummy line 13 and a bit line 14 as an input signal and senses and amplifies data of a memory cell 12; and a voltage variable unit 20 which adjusts the voltages of the dummy line 13 and the bit line 14.

Figure 1:
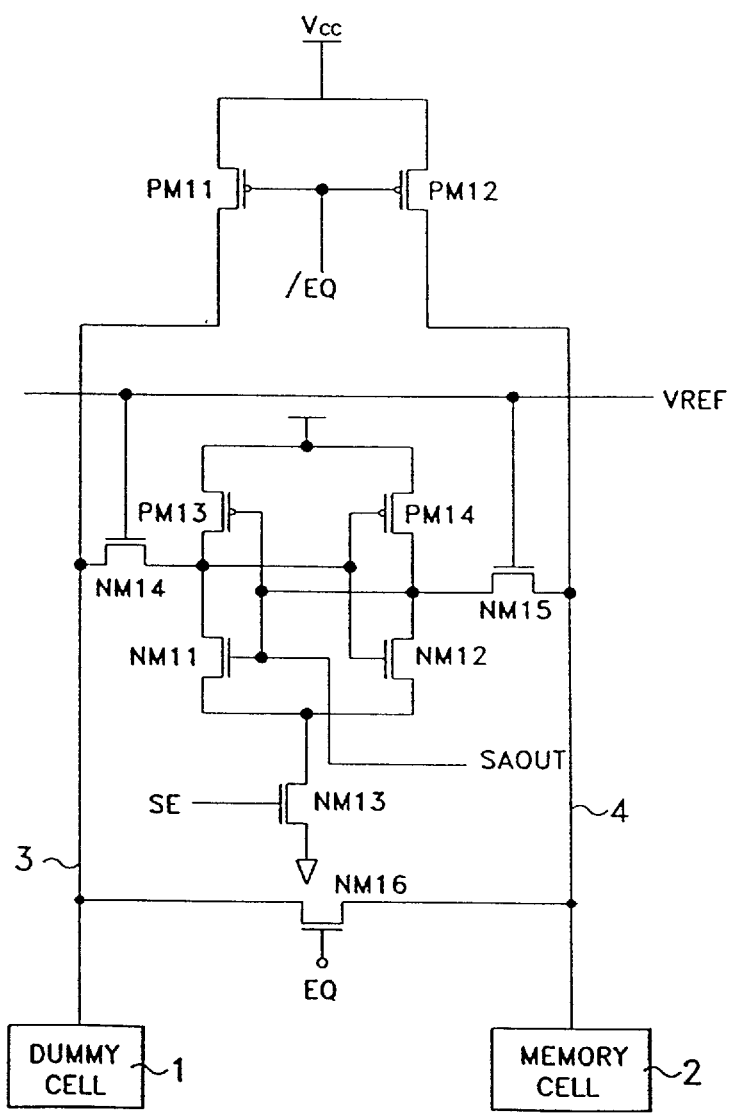
FIG. 1 is a circuit diagram illustrating a conventional sense amplifier of a semiconductor memory device.

The sense amplifying unit 10 has the same configuration as FIG. 1. In more detail, the sense amplifying unit 10 comprises a precharging part which precharges the dummy line 13 and the bit line 14 by a first equalizing signal /EQ11, and a sense amplifying part which inputs the voltages of the dummy line 13 and the bit line 14 by a sense amplifier enable signal SE and which then senses and amplifies the data of the memory cell 12.

The precharging part within the sense amplifying unit 10 includes first and second PMOS transistors PM11 and PM12 having their gates to which the first equalizing signal /EQ11 is applied, to thereby precharge the dummy line 13 and the bit line 14.

Moreover, the sense amplifying part within the sense amplifying unit 10 includes a first CMOS transistor CM11 which is comprised of a third PMOS transistor PM13 and a first NMOS transistor NM11 and a second CMOS transistor CM12 which is comprised of a fourth PMOS transistor PM14 and a second NMOS transistor NM12. Further, the sense amplifying part preferably includes third NMOS transistor NM13 which a sense amplifier enable signal SE is applied to, enables the first and second CMOS transistor CM11 and CM12, fourth NMOS transistor NM14 as a pass transistor which supplies, by a reference voltage signal VREF, a signal applied via the dummy line 13 to the first CMOS transistor CM11 as an input signal, a fifth NMOS transistor NM15 as a pass transistor which supplies, by the reference voltage signal VREF, a signal applied via the bit line 14 to the second CMOS transistor CM12 as an input signal and a sixth NMOS transistor NM16 which equalizes the dummy line 13 and the bit line 14 by a first equalizing signal EQ11.

The voltage variable unit 20 has a first voltage variable part 21 which adjusts the voltage of the dummy line 13 by a second equalizing signal EQ12 and a second voltage variable part 22 which adjusts the voltage of the bit line 14 by a second equalizing signal EQ12.

The first voltage variable part 21 within the voltage variable unit 20 includes: a first CMOS transistor CM21 which has a first PMOS transistor PM21 and a first NMOS transistor NM21 for respectively inputting a second equalizing signal EQ12; and a first variable capacitor VC21 which has a MOS transistor MN21, connected between the first CMOS transistor CM21 and the dummy line 13, for adjusting the voltage of the dummy line 13.

The second voltage variable part 22 within the voltage variable unit 20 is comprised of: a second CMOS transistor CM22 which has a second PMOS transistor PM22 and a second NMOS transistor NM22 for respectively inputting the second equalizing signal EQ12; and a second variable capacitor VC22 which has a second MOS transistor MN22, connected between the second CMOS transistor CM22 and the bit line 14, for adjusting the voltage of the bit line 14.

Figures 1, 3A:
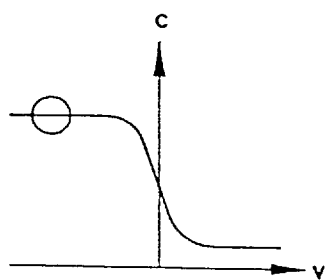
Figures 2, 3A:
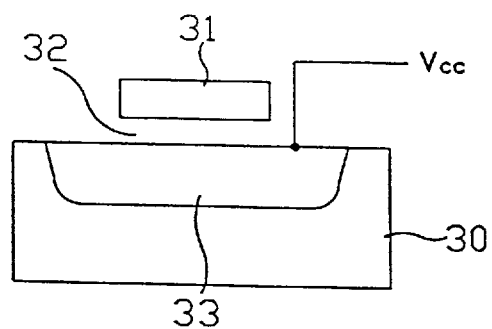
Figures 1, 3B:
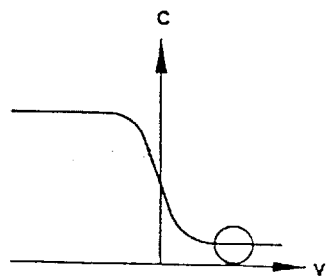
Figures 2, 3B:
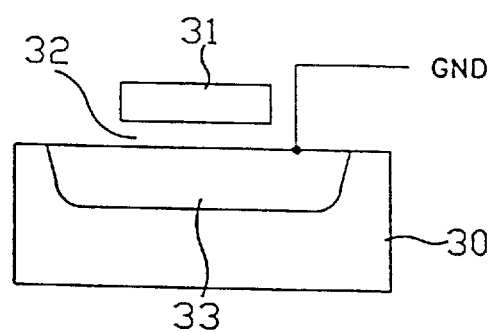

FIGS. 3A-1 and 3B-1 are waveform diagrams illustrating operation characteristics of the first and second variable capacitors within the voltage variable unit 20 of FIG. 2.

Referring to FIGS. 3A-2 and 3B-2, each of the variable capacitors is comprised of a gate oxide film capacitor and uses as a capacitor dielectric film a gate oxide film 32 disposed between a gate 31 and a p-well 33 formed on a semiconductor substrate 30.

The gate oxide film capacitor has an increased capacitance characteristic, as shown in FIG. 3A-1, if a power supply voltage Vcc of logic "high" level is applied to the p-well 33 as shown in FIG. 3A-2, whereas the gate oxide film capacitor has a decreased capacitance characteristic, as shown in FIG. 3B-1, if a ground voltage Vss of logic "low" level is applied to the p-well as shown in FIG. 3B-2.

Accordingly, capacitance C is varied in accordance with a voltage level applied to the p-well 33 of the gate oxide film capacitor, such that a voltage difference between the dummy line 13 and the bit line 14 can increase, based upon the principle of Q=CV.

It is accordingly assumed that capacitance of the bit line 14 is "C0", capacitance of the variable capacitor connected to the bit line 14 is "C1", in the case where the power supply voltage Vcc of logic "high" level is applied to the p-well 33, and capacitance of the variable capacitor connected to the bit line 14 is "C2", in the case where the ground voltage Vss of logic "low" level is applied to the p-well 33. When the second variable capacitor VC22 is coupled to the bit line 14, the capacitance Cbit of the bit line 14 is varied as follows: first, if the power supply voltage Vcc of logic "high" level is applied to the p-well 33 of the second variable capacitor VC22, the capacitance Cbit of the bit line 14 is equal to "C0+C1"; and second, if the ground voltage Vss of logic "low" level is applied to the p-well 33 of the second variable capacitor VC22, the capacitance Cbit of the bit line 14 is equal to "C0+C2".

As shown in FIGS. 3A-1 and 3B-1, the capacitance C1 when the power supply voltage Vcc of logic "high" level is applied to the p-well 33 is greater than the capacitance C2 when the ground voltage Vss of logic "low" level is applied.

Accordingly, in order to maintain a predetermined charge amount Q, a voltage V has to be adjusted as capacitance is varied by means of the variable capacitor.

$$V1=Q/(C0+C1) \quad V2=Q/(C0+C1)$$

Assuming that the voltage of the bit line 14 is "V1", in the case where the power supply voltage is applied to the p-well 33 of the second variable capacitor VC22, and the voltage of the bit line 14 is "V2", in the case where the ground voltage Vss is applied to the p-well 33 of the second variable capacitor VC22, the voltages "V1" and "V21" are given by the following equations. At the time, since the capacitance C1 is greater than the capacitance C2, the voltage V2 of the bit line 14 is higher than the voltage V1.

Therefore, the voltage V2 is connected as the voltage of the bit line 14, so that the voltage difference between the bit line 14 and the dummy line 13 can be increased.

The structure and operation of the first variable capacitor VC21 is the same as that of the second variable capacitor VC22 mentioned in the above.

Figures 4A, 4B:
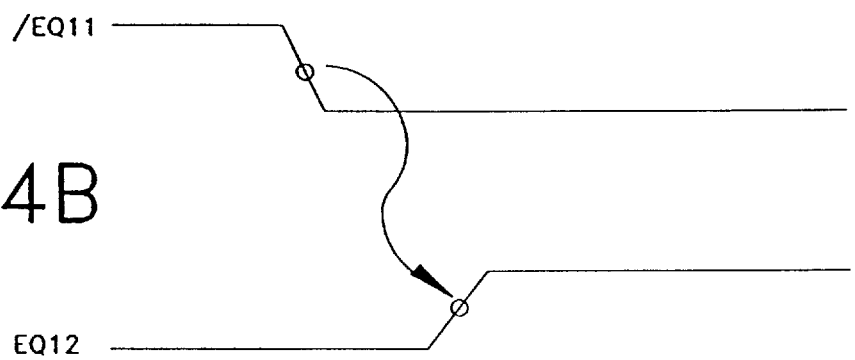
FIGS. 4A and 4B are waveform diagrams illustrating first and second equalizing signals applied to the sense amplifier of FIG. 2.

FIGS. 4A and 4B are waveform diagrams illustrating first and second equalizing signals applied to the sense amplifier of FIG. 2. Referring to FIG. 4A, when the first equalizing signal /EQ11 is applied, the precharging part, i.e., the first and second PMOS transistors PM11 and PM12 within the sense amplifying unit 10 are turned on, to thereby precharge the dummy line 13 and the bit line 14 to a predetermine voltage level.

Next, when the second equalizing signal EQ12 is applied to the voltage variable unit 20, as shown in FIG. 4B, the voltage of the bit line 14 is adjusted as discussed in the above.

At the time, the second equalizing signal EQ12 is delayed by a predetermined time of period and has an inverted phase, when compared with the first equalizing signal /EQ11.

Hence, the voltage difference between the dummy line 13 connected to the dummy cell 11 and the bit line 14 connected to the memory cell 12 increases, thus to enlarge a sensing margin of the sense amplifier. Accordingly, the sense amplifier can accurately sense and amplify the data of the memory cell 12 and output the sensed and amplified data to the output terminal SAOUT.

The sense amplifying unit 10 embodied according to the present invention has a latch type, but may have other types.

As set forth in the above, a sense amplifier of a semiconductor memory device which can increase a voltage difference between a dummy line and a bit line and enlarge a sensing margin thereof, by connecting variable capacitors within a voltage variable unit to the dummy line and the bit line, respectively, so that the sense amplifier can accurately sense and amplify data from a memory cell.

It will be apparent to those skilled in the art that various modifications and variations can be made in a sense amplifier of a semiconductor memory device of the present invention without departing from the spirit or scope of the invention. Thus, it is intended that the present invention cover the modifications and variations of this invention provided they come within the scope of the appended claims and their equivalents.

What is claimed is:

1. A sense amplifier of a semiconductor memory device, comprising:

a sense amplifying unit for precharging voltage of a dummy line connected to a dummy cell and of a bit line connected to a memory cell by a first equalizing signal and for sensing and amplifying data from the memory cell in accordance with a voltage difference between said dummy line and said bit line upon receiving a sense amplifier enable signal; and a voltage variable unit for adjusting the voltages of said dummy line and said bit line by a second equalizing signal to increase the voltage difference between said bit line and said dummy line.

2. The sense amplifier as defined in claim 1, wherein said voltage variable unit is comprised of a first voltage variable part which adjusts the voltage of said dummy line by said second equalizing signal and a second voltage variable part which adjusts the voltage of said bit line by said second equalizing signal.

3. The sense amplifier as defined in claim 2, wherein said first voltage variable part is comprised of a first inverter which inverts said second equalizing signal and a first variable capacitor which is connected between an output signal of said first inverter and said dummy line, for adjusting the voltage of said dummy line.

4. The sense amplifier as defined in claim 3, wherein said first inverter of said first voltage variable part is comprised of a first CMOS transistor pair which has a first PMOS transistor and a first NMOS transistor for respectively inputting said second equalizing signal.

5. The sense amplifier as defined in claim 4, wherein said first variable capacitor of said first voltage variable part is comprised of a MOS transistor which is connected between said first CMOS transistor pair and said dummy line.

6. The sense amplifier as defined in claim 2, wherein said second voltage variable part is comprised of an inverter which inverts said second equalizing signal and a second variable capacitor which is connected between an output signal of said inverter and said bit line, for adjusting the voltage of said bit line.

7. The sense amplifier as defined in claim 6, wherein said inverter of said second voltage variable part is comprised of a CMOS transistor pair which has a PMOS transistor and a NMOS transistor for respectively inputting said second equalizing signal.

8. The sense amplifier as defined in claim 7, wherein said second variable capacitor of said second voltage variable part is comprised of a MOS transistor which is connected between said CMOS transistor pair and said bit line.

9. The sense amplifier as defined in claim 1, wherein said second equalizing signal has a delayed inversion phase when compared with said first equalizing signal.

* * * * *